United States Patent
Fujitani et al.

(10) Patent No.: US 9,927,705 B2
(45) Date of Patent: Mar. 27, 2018

(54) ADDITIVE FOR RESIST UNDERLAYER FILM-FORMING COMPOSITION AND RESIST UNDERLAYER FILM-FORMING COMPOSITION CONTAINING THE SAME

(71) Applicant: NISSAN CHEMICAL INDUSTRIES, LTD., Tokyo (JP)

(72) Inventors: Noriaki Fujitani, Toyama (JP); Takafumi Endo, Toyama (JP); Ryuji Ohnishi, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/904,316

(22) PCT Filed: Jul. 16, 2014

(86) PCT No.: PCT/JP2014/068933
§ 371 (c)(1),
(2) Date: Jan. 11, 2016

(87) PCT Pub. No.: WO2015/012172
PCT Pub. Date: Jan. 29, 2015

(65) Prior Publication Data
US 2016/0147152 A1    May 26, 2016

(30) Foreign Application Priority Data
Jul. 23, 2013   (JP) .................................. 2013-152902

(51) Int. Cl.
| | | |
|---|---|---|
| G03F 7/11 | (2006.01) | |
| G03F 7/16 | (2006.01) | |
| G03F 7/20 | (2006.01) | |
| C08F 222/10 | (2006.01) | |
| G03F 7/32 | (2006.01) | |
| G03F 7/36 | (2006.01) | |
| H01L 21/3065 | (2006.01) | |
| H01L 21/308 | (2006.01) | |
| H01L 21/027 | (2006.01) | |
| H01L 21/033 | (2006.01) | |

(52) U.S. Cl.
CPC .............. *G03F 7/11* (2013.01); *C08F 222/10* (2013.01); *G03F 7/168* (2013.01); *G03F 7/2053* (2013.01); *G03F 7/32* (2013.01); *G03F 7/36* (2013.01); *H01L 21/3065* (2013.01); *H01L 21/3081* (2013.01); *H01L 21/3085* (2013.01); *H01L 21/3086* (2013.01); *H01L 21/3088* (2013.01); *H01L 21/0276* (2013.01); *H01L 21/0332* (2013.01)

(58) Field of Classification Search
None
See application file for complete search history.

(56) References Cited

U.S. PATENT DOCUMENTS

| | | | |
|---|---|---|---|
| 2002/0031729 A1 | 3/2002 | Trefonas et al. | |
| 2003/0146416 A1 | 8/2003 | Takei et al. | |
| 2008/0227037 A1 | 9/2008 | Hatakeyama et al. | |
| 2009/0311624 A1* | 12/2009 | Horiguchi | G03F 7/091 430/271.1 |
| 2010/0081081 A1* | 4/2010 | Enomoto | G03F 7/2059 430/270.1 |
| 2012/0077345 A1* | 3/2012 | Saito | C08G 12/26 438/703 |

(Continued)

FOREIGN PATENT DOCUMENTS

| | | |
|---|---|---|
| JP | 2002-072489 A | 3/2002 |
| JP | 2003-057828 A | 2/2003 |
| JP | 2005-049810 A | 2/2005 |

(Continued)

OTHER PUBLICATIONS

Trefonas et al. "Organic antireflective coatings for 193nm lithography", Proc. SPIE vol. 3678 pp. 702-712 (Mar. 1299).*
Young et al., "Depth of focus in microscopy", SCIA93, Proc of 8th Scandinanvian Conferneces on image analysis, pp. 493-498 (1993).*
Oct. 21, 2014 International Search Report issued in International Patent Application No. PCT/JP2014/068933.

(Continued)

*Primary Examiner* — Martin J Angebranndt
(74) *Attorney, Agent, or Firm* — Oliff PLC

(57) ABSTRACT

An additive for a resist underlayer film-forming composition that modifies a surface state of a resist underlayer film into a hydrophobic state to enhance adhesion between the resist underlayer film and a resist pattern formed on the resist underlayer film, and a resist underlayer film-forming composition containing the additive. An additive for a resist underlayer film-forming composition including a polymer having a structural unit of Formula (1):

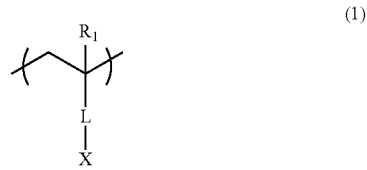

(1)

(wherein R1 is a hydrogen atom or methyl group, L is a single bond or a divalent linking group, and X is an aliphatic hydrocarbon group, an alicyclic hydrocarbon group, or a heterocyclic group having an oxygen atom as a heteroatom that does not have a hydroxy group). A resist underlayer film-forming composition for lithography including a resin binder, an organic solvent, and the additive.

4 Claims, No Drawings

(56) References Cited

U.S. PATENT DOCUMENTS

2014/0220783 A1    8/2014  Koumura et al.
2017/0108777 A1*  4/2017  Hashimoto ............... G03F 7/11

FOREIGN PATENT DOCUMENTS

| JP | 2007-119572 | * | 5/2007 |
|----|----|----|----|
| JP | 2008-203364 | A | 9/2008 |
| JP | 2008-257188 | A | 10/2008 |
| JP | 2010-266857 | * | 11/2010 |
| TW | 201039067 | A | 11/2010 |
| TW | 201321901 | A | 6/2013 |
| WO | 03/017002 | A1 | 2/2003 |
| WO | 2010/074075 | A1 | 7/2010 |
| WO | 2013/058189 | A1 | 4/2013 |

OTHER PUBLICATIONS

Oct. 21, 2014 Written Opinion of the International Searching Authority issued in International Patent application No. PCT/JP2014/068933.

Nov. 15, 2017 Office Action issued in Taiwanese Patent Application No. 103125107.

* cited by examiner

ADDITIVE FOR RESIST UNDERLAYER FILM-FORMING COMPOSITION AND RESIST UNDERLAYER FILM-FORMING COMPOSITION CONTAINING THE SAME

TECHNICAL FIELD

The present invention relates to an additive to be added to a resist underlayer film-forming composition. The present invention particularly relates to an additive (modifier) that aims to modify a surface layer of a resist underlayer film to be formed into hydrophobicity, enhance adhesion to a resist, and form a pattern of desired shape on the resist underlayer film. Further, the present invention relates to a resist underlayer film-forming composition containing the additive (modifier).

BACKGROUND ART

In ArF immersion lithography and extreme ultraviolet light (EUV) lithography, shrinkage of processing dimension of a resist line has been required. In the formation of a finer resist pattern as described above, when a contact area between the resist pattern and an underlying substrate decreases, an aspect ratio of the resist pattern (height of the resist pattern/line width of the resist pattern) increases. Thus, there is a concern that the resist pattern is likely to collapse. Therefore, for a resist underlayer film (anti-reflective coating) that contacts a resist, high adhesion to the resist has been required such that the collapse of the resist pattern does not occur.

It has reported that when a lactone structure is used as a component of a resist underlayer film-forming composition to exhibit high adhesion to the resist in the resist underlayer film, the adhesion to a resist pattern to be obtained is enhanced (Patent Document 1). Therefore, when a structure containing a polar moiety like the lactone structure is used as the component of the resist underlayer film-forming composition, the adhesion to the resist pattern is enhanced. Accordingly, prevention of collapse of the resist pattern in the finer resist pattern has been expected.

However, in a lithography process that requires the formation of the finer resist pattern, such as ArF immersion lithography and extreme ultraviolet light (EUV) lithography, only the lactone structure that is the component of the resist underlayer film-forming composition cannot sufficiently prevent the collapse of the resist pattern.

On the other hand, examples of procedures of exhibiting high adhesion to the resist include a method for controlling a chemical state of an interface between the resist and the resist underlayer film. Patent Document 2 describes an additive for a resist underlayer film-forming composition that can suppress conversion of a resist pattern shape into an undercut shape by modifying a surface state of a resist underlayer film into a basic state.

PRIOR ART DOCUMENTS

Patent Documents

Patent Document 1: WO 03/017002
Patent Document 2: WO 2013/058189

SUMMARY OF THE INVENTION

Problem to be Solved by the Invention

In recent years, in order to suppress pattern collapse due to formation of a finer resist pattern, Laplace force during a rinsing step with pure water is reduced by hydrophobizing a resist. Therefore, a resist underlayer film is also hydrophobized. Thus, enhancement of adhesion between the resist and the resist underlayer film is expected.

It is an object of the present invention to provide an additive for a resist underlayer film-forming composition that modifies a surface state of a resist underlayer film into a hydrophobic state to enhance adhesion between the resist underlayer film and a resist pattern formed on the resist underlayer film.

Means for Solving the Problem

A first aspect of the present invention is an additive for a resist underlayer film-forming composition comprising a polymer having a structural unit of Formula (1):

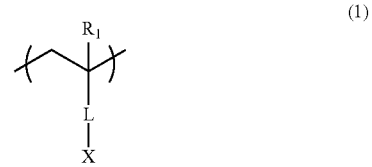

(wherein $R_1$ is a hydrogen atom or methyl group, L is a single bond or a divalent linking group, and X is an aliphatic hydrocarbon group, an alicyclic hydrocarbon group, or a heterocyclic group having an oxygen atom as a heteroatom that does not have a hydroxy group).

The polymer may be a copolymer further having one or more structural units of Formula (2):

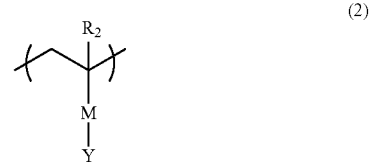

(wherein $R_2$ is a hydrogen atom or methyl group, M is a single bond or a linking group containing at least one selected from the group consisting of a —C(=O)— group, a —CH$_2$— group, and a —O— group, and Y is a $C_{2-6}$ alkyl group in which at least one hydrogen atom is substituted by a fluorine atom, or a $C_{1-6}$ alkyl group having at least one hydroxy group, alkoxy group, or carboxyl group).

For example, the divalent linking group contains at least one selected from the group consisting of a —C(=O)— group, a —CH$_2$— group, a —O— group, and a phenylene group.

A second aspect of the present invention is a resist underlayer film-forming composition for lithography comprising a resin binder, an organic solvent, and the additive for a resist underlayer film-forming composition according to the first aspect. The resist underlayer film-forming composition may further contain a cross-linking agent and a cross-linking catalyst.

The polymer (copolymer) in the additive for a resist underlayer film-forming composition is contained in an amount of 0.1% by mass to 30% by mass, preferably 1% by mass to 15% by mass, and more preferably 5% by mass to 15% by mass, relative to a solid content of the resist underlayer film-forming composition obtained by removing the organic solvent.

A third aspect of the present invention is a method for producing a semiconductor element, wherein the resist underlayer film-forming composition according to the second aspect is applied onto a substrate having a film to be processed to form a transferred pattern and the resist underlayer film-forming composition is baked to form a resist underlayer film, the resist underlayer film is coated with a resist, the substrate coated with the resist is irradiated with a radiation selected from the group consisting of a KrF excimer laser, an ArF excimer laser, an extreme ultraviolet light, and an electron beam, and the resist is developed to form a resist pattern and dry-etched using the resist pattern as a mask to transfer the pattern onto the substrate.

Effects of the Invention

When a resist underlayer film-forming composition in which the additive according to the present invention is added is applied to a lithography process, the adhesion between a resist underlayer film and a resist pattern is enhanced without converting a surface state of the resist underlayer film into a basic state, that is, without tapering a resist pattern shape. Additionally, in the formation of a resist pattern having a finer line width, the collapse of the formed resist pattern is effectively suppressed.

MODES FOR CARRYING OUT THE INVENTION

The additive according to the first aspect of the present invention contains a polymer having a structural unit of Formula (1), and may be in a solution form in which the polymer is dissolved in an organic solvent described below. The polymer may be a homopolymer or a copolymer. A divalent linking group of L in Formula (1) is not particularly limited as long as it contains at least one selected from the group consisting of a —C(═O)— group, a —CH$_2$— group, a —O— group, and a phenylene group. Examples thereof include a —C(═O)O— group, a —C(═O)O—CH$_2$— group, a phenylene group, and a phenyleneoxy group.

The structural unit of Formula (1) is, for example, represented by any of the following Formulae (1-1) to (1-16). In the following Formula (1-4), n is an integer of 1 to 17.

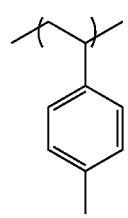

(1-1)

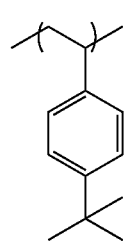

(1-2)

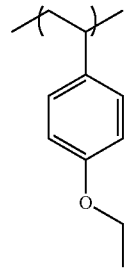

(1-3)

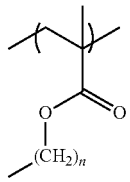

(1-4)

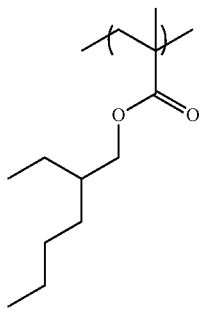

(1-5)

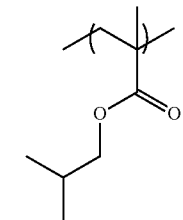

(1-6)

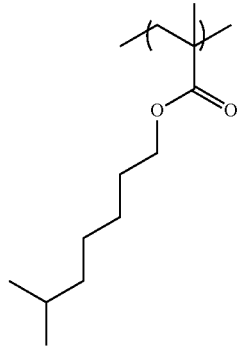

(1-7)

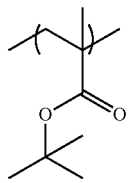

(1-8)

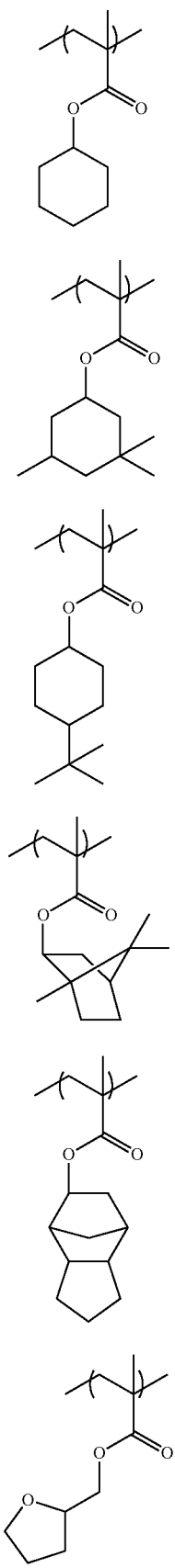

(1-9)
(1-10)
(1-11)
(1-12)
(1-13)
(1-14)

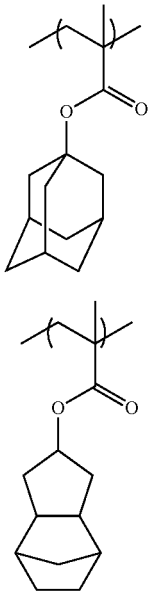

(1-15)
(1-16)

When the additive according to the first aspect of the present invention contains a copolymer having the structural unit of Formula (1) and one or more structural units of Formula (2), examples of a linking group of M containing at least one selected from the group consisting of a —C(=O)— group, a —CH$_2$— group, and a —O— group in Formula (2) include a —C(=O)O— group and a —C(=O)O—CH$_2$— group. When M is a direct bond, a C$_{2-6}$ alkyl group in which at least one hydrogen atom is substituted by a fluorine atom, or a C$_{1-6}$ alkyl group having at least one hydroxy group, alkoxy group, or carboxyl group, which is represented by Y, is directly bonded to a main chain. Examples of the alkoxy group include methoxy group, ethoxy group, and tert-butoxy group. Examples of a monomer forming the structural unit of Formula (2) include monofluoroethyl acrylate, monofluoroethyl methacrylate, trifluoroethyl acrylate, trifluoroethyl methacrylate, tetrafluoropropyl acrylate, tetrafluoropropyl methacrylate, pentafluoropropyl acrylate, pentafluoropropyl methacrylate, hexafluoropropyl acrylate, hexafluoropropyl methacrylate, hexafluoroisopropyl acrylate, hexafluoroisopropyl methacrylate, hexafluorobutyl acrylate, hexafluorobutyl methacrylate, heptafluorobutyl acrylate, heptafluorobutyl methacrylate, octafluoropentyl acrylate, octafluoropentyl methacrylate, hydroxyethyl acrylate, hydroxyethyl methacrylate, hydroxypropyl acrylate, hydroxypropyl methacrylate, dihydroxypropyl acrylate, dihydroxypropyl methacrylate, hydroxybutyl acrylate, hydroxybutyl methacrylate, hydroxypentyl acrylate, and hydroxypentyl methacrylate. Among these examples, trifluoroethyl methacrylate and hydroxypropyl methacrylate are preferred.

In order to suppress the collapse of a resist pattern and improve the functionality of a resist underlayer film by adopting the structural unit of Formula (2), the monomer forming one or more structural units of Formula (2) is used in an amount of 30% by mass to 60% by mass, and preferably 40% by mass to 50% by mass, relative to the entire amount of monomer forming the copolymer.

The resist underlayer film-forming composition according to the second aspect of the present invention is configured such that the additive for a resist underlayer film-forming composition of the present invention is contained in an organic solvent together with a resin binder. The content ratio of the polymer having the structural unit of Formula (1) or the copolymer having the structural unit of Formula (1) and the structural unit of Formula (2) relative to a solid content of the resist underlayer film-forming composition obtained by removing the organic solvent is, for example, 0.5% by mass to 30% by mass. The weight average molecular weight of the polymer or the copolymer is, for example, 3,000 to 50,000, and preferably 4,000 to 20,000. The weight average molecular weight is a value determined by gel permeation chromatography (GPC) using polystyrene as a standard sample.

Examples of the organic solvent contained in the resist underlayer film-forming composition of the present invention include propylene glycol monomethyl ether (PGME), propylene glycol monomethyl ether acetate (PGMEA), propylene glycol monoethyl ether, propylene glycol monopropyl ether, methyl ethyl ketone, ethyl lactate, cyclohexanone, γ-butyrolactone, N-methylpyrrolidone, and a mixture of two or more selected from the organic solvents. The ratio of the organic solvent in the resist underlayer film-forming composition of the present invention is, for example, 50% by mass to 99.5% by mass.

As the resin binder contained in the resist underlayer film-forming composition of the present invention, for example, a polymer obtained in Synthesis Example 1 described below can be used. As the resin binder, a base polymer contained in a known anti-reflective coating-forming composition or a known resist underlayer film-forming composition can be used. The ratio of the resin binder to the solid content of the resist underlayer film-forming composition of the present invention obtained by removing the organic solvent is, for example, 50% by mass to 99.5% by mass, and preferably 60% by mass to 90% by mass.

The resist underlayer film-forming composition of the present invention may contain a cross-linking agent as an optional component. Examples of such a cross-linking agent include hexamethoxymethyl melamine, tetramethoxymethyl benzoguanamine, 1,3,4,6-tetrakis(methoxymethyl) glycoluril (POWDERLINK [registered trademark] 1174), 1,3,4,6-tetrakis(butoxymethyl) glycoluril, 1,3,4,6-tetrakis(hydroxymethyl) glycoluril, 1,3-bis(hydroxymethyl)urea, 1,1,3,3-tetrakis(butoxymethyl)urea, and 1,1,3,3-tetrakis(methoxymethyl)urea. When the cross-linking agent is used, the content of the cross-linking agent relative to the resin binder is, for example, 1% by mass to 30% by mass.

The resist underlayer film-forming composition of the present invention may contain a cross-linking catalyst promoting a crosslinking reaction as an optional component. Examples of such a cross-linking catalyst include sulfonic acid compounds and carboxylic acid compounds such as p-toluenesulfonic acid, trifluoromethanesulfonic acid, pyridinium p-toluenesulfonate, salicylic acid, camphorsulfonic acid, 5-sulfosalicylic acid, 4-chlorobenzenesulfonic acid, 4-hydroxybenzenesulfonic acid, benzenesulfonic acid, 1-naphthalenesulfonic acid, citric acid, benzoic acid, and hydroxybenzoic acid. When the cross-linking catalyst is used, the content ratio of the cross-linking catalyst relative to the cross-linking agent is, for example, 0.1% by mass to 10% by mass. When the resin binder is a self-crosslinkable polymer, the cross-linking agent and the cross-linking catalyst are components that are not necessary for the resist underlayer film-forming composition of the present invention.

A substrate used in the method for producing a semiconductor element according to the third aspect of the present invention is typically a silicon wafer. However, a silicon on insulator (SOI) substrate or a wafer of a compound semiconductor such as gallium arsenide (GaAs), indium phosphide (InP), and gallium phosphide (GaP) may be used. On the substrate, for example, an insulator film such as a silicon oxide film, a nitrogen-containing silicon oxide film (SiON film), a carbon-containing silicon oxide film (SiOC film), and a fluorine-containing silicon oxide film (SiOF film) is formed as a film to be processed. In this case, a resist underlayer film is formed on the film to be processed.

In the method according to the present invention, a resist solution used for coating with a resist may be positive or negative, and a chemically amplified resist that is sensitive to a radiation selected from the group consisting of a KrF excimer laser, an ArF excimer laser, an extreme ultraviolet light, and an electron beam can be used.

In the method according to the present invention, an alkaline developer such as a tetramethylammonium hydroxide (TMAH) aqueous solution can be used as a developer used in development after irradiation with a radiation as described above.

EXAMPLES

Hereinafter, the present invention will be specifically described with reference to Synthesis Examples and Examples. However, the present invention is not limited to descriptions in Synthesis Examples and Examples.

The weight average molecular weights of polymers shown in the following Synthesis Examples 1 to 7 of the present invention are results measured by gel permeation chromatography (hereinafter abbreviated as GPC). In the measurement, a GPC device manufactured by TOSOH CORPORATION was used, and the measurement conditions are as follows.

GPC column: Shodex [registered trademark] Asahipak [registered trademark] (manufactured by Showa Denko K.K.)
Column temperature: 40° C.
Solvent: N,N-dimethyl formamide (DMF)
Flow rate: 0.6 mL/min
Standard sample: polystyrene (TOSOH CORPORATION)

Synthesis Example 1

10.00 g of monoallyl diglycidyl isocyanurate (manufactured by Shikoku Chemicals Corporation), 6.64 g of 5-hydroxyisophthalic acid, and 0.41 g of benzyltriethylammonium chloride were dissolved in 64.11 g of propylene glycol monomethyl ether. The mixture was reacted at 130° C. for 4 hours to obtain a solution containing a polymer. The obtained polymer was analyzed by GPC. The weight average molecular weight in terms of standard polystyrene was 15,000. The polymer obtained in this Synthesis Example corresponds to the resin binder contained in the resist underlayer film-forming composition according to the present invention.

Synthesis Example 2

A solution obtained by dissolving 5.00 g of tert-butyl methacrylate, 3.04 g of trifluoroethyl methacrylate, and 2.36 g of hydroxypropyl methacrylate in 30.8 g of propylene glycol monomethyl ether was heated and refluxed. To the heated and refluxed solution, a solution obtained by dissolving 0.57 g of azobisisobutyronitrile in 13.2 g of propylene glycol monomethyl ether was slowly added dropwise. After the dropwise addition, the mixture was reacted for 24 hours by heating and refluxing to obtain a solution containing a polymer. The obtained polymer was analyzed by GPC. The weight average molecular weight in terms of standard polystyrene was 4,200. The polymer obtained in this Synthesis Example corresponds to the copolymer contained in the additive according to the present invention.

Synthesis Example 3

A solution obtained by dissolving 5.00 g of 1-adamantyl methacrylate, 1.53 g of trifluoroethyl methacrylate, and 1.97 g of hydroxypropyl methacrylate in 17.2 g of propylene glycol monomethyl ether was heated and refluxed. To the heated and refluxed solution, a solution obtained by dissolving 0.37 g of azobisisobutyronitrile in 18.6 g of propylene glycol monomethyl ether was slowly added dropwise. After the dropwise addition, the mixture was reacted for 24 hours by heating and refluxing to obtain a solution containing a polymer. The obtained polymer was analyzed by GPC. The weight average molecular weight in terms of standard polystyrene was 5,000. The polymer obtained in this Synthesis Example corresponds to the copolymer contained in the additive according to the present invention.

Synthesis Example 4

A solution obtained by dissolving 5.00 g of tert-butylstyrene, 2.10 g of trifluoroethyl methacrylate, and 2.70 g of hydroxypropyl methacrylate in 16.3 g of propylene glycol monomethyl ether was heated and refluxed. To the heated and refluxed solution, a solution obtained by dissolving 0.51 g of azobisisobutyronitrile in 25.6 g of propylene glycol monomethyl ether was slowly added dropwise. After the dropwise addition, the mixture was reacted for 24 hours by heating and refluxing to obtain a solution containing a polymer. The obtained polymer was analyzed by GPC. The weight average molecular weight in terms of standard polystyrene was 10,000. The polymer obtained in this Synthesis Example corresponds to the copolymer contained in the additive according to the present invention.

Synthesis Example 5

A solution obtained by dissolving 5.00 g of dicyclopentanyl methacrylate, 1.96 g of trifluoroethyl methacrylate, and 1.53 g of hydroxypropyl methacrylate in 17.2 g of propylene glycol monomethyl ether was heated and refluxed. To the heated and refluxed solution, a solution obtained by dissolving 0.37 g of azobisisobutyronitrile in 18.6 g of propylene glycol monomethyl ether was slowly added dropwise. After the dropwise addition, the mixture was reacted for 24 hours by heating and refluxing to obtain a solution containing a polymer. The obtained polymer was analyzed by GPC. The weight average molecular weight in terms of standard polystyrene was 14,000. The polymer obtained in this Synthesis Example corresponds to the copolymer contained in the additive according to the present invention.

Synthesis Example 6

A solution obtained by dissolving 5.00 g of isobornyl methacrylate, 1.95 g of trifluoroethyl methacrylate, and 1.51 g of hydroxypropyl methacrylate in 17.2 g of propylene glycol monomethyl ether was heated and refluxed. To the heated and refluxed solution, a solution obtained by dissolving 0.37 g of azobisisobutyronitrile in 18.5 g of propylene glycol monomethyl ether was slowly added dropwise. After the dropwise addition, the mixture was reacted for 24 hours by heating and refluxing to obtain a solution containing a polymer. The obtained polymer was analyzed by GPC. The weight average molecular weight in terms of standard polystyrene was 11,000. The polymer obtained in this Synthesis Example corresponds to a copolymer contained in the additive according to the present invention.

Synthesis Example 7

A solution obtained by dissolving 5.00 g of tetrahydrofurfuryl methacrylate, 2.54 g of trifluoroethyl methacrylate, and 1.98 g of hydroxypropyl methacrylate in 16.4 g of propylene glycol monomethyl ether was heated and refluxed. To the heated and refluxed solution, a solution obtained by dissolving 0.48 g of azobisisobutyronitrile in 24.1 g of propylene glycol monomethyl ether was slowly added dropwise. After the dropwise addition, the mixture was reacted for 24 hours by heating and refluxing to obtain a solution containing a polymer. The obtained polymer was analyzed by GPC. The weight average molecular weight in terms of standard polystyrene was 14,000. The polymer obtained in this Synthesis Example corresponds to the copolymer contained in the additive according to the present invention.

Synthesis Example 8

A solution obtained by dissolving 5.00 g of hydroxypropyl methacrylate and 1.46 g of trifluoroethyl methacrylate in 9.8 g of propylene glycol monomethyl ether was heated and refluxed. To the heated and refluxed solution, a solution obtained by dissolving 0.36 g of azobisisobutyronitrile in 17.4 g of propylene glycol monomethyl ether was slowly added dropwise. After the dropwise addition, the mixture was reacted for 24 hours by heating and refluxing to obtain a solution containing a polymer. The obtained polymer was analyzed by GPC. The weight average molecular weight in terms of standard polystyrene was 6,000.

Synthesis Example 9

A solution obtained by dissolving 5.00 g of 3-hydroxy-1-adamantyl methacrylate, 1.42 g of trifluoroethyl methacrylate, and 1.83 g of hydroxypropyl methacrylate in 17.4 g of propylene glycol monomethyl ether was heated and refluxed. To the heated and refluxed solution, a solution obtained by dissolving 0.35 g of azobisisobutyronitrile in 17.4 g of propylene glycol monomethyl ether was slowly added dropwise. After the dropwise addition, the mixture was reacted for 24 hours by heating and refluxing to obtain a solution containing a polymer. The obtained polymer was analyzed by GPC. The weight average molecular weight in terms of standard polystyrene was 5,000.

Example 1

1.00 g of the polymer solution (resin binder) obtained in Synthesis Example 1, 0.10 g of the polymer solution (additive) obtained in Synthesis Example 2, 0.25 g of tetramethoxymethyl glycoluril (trade name: POWDERLINK [registered trademark] 1174, manufactured by Nihon Cytec Industries Inc.), 0.025 g of p-toluene sulfonic acid, 191.5 g of propylene glycol monomethyl ether, and 82.1 g of propylene glycol monoethyl ether were mixed and dissolved to prepare the resist underlayer film-forming composition of the present invention.

Example 2

1.00 g of the polymer solution (resin binder) obtained in Synthesis Example 1, 0.10 g of the polymer solution (additive) obtained in Synthesis Example 3, 0.25 g of tetramethoxymethyl glycoluril (trade name: POWDERLINK [registered trademark] 1174, manufactured by Nihon Cytec Industries Inc.), 0.025 g of p-toluene sulfonic acid, 191.5 g of propylene glycol monomethyl ether, and 82.1 g of propylene glycol monoethyl ether were mixed and dissolved to prepare the resist underlayer film-forming composition of the present invention.

Example 3

1.00 g of the polymer solution (resin binder) obtained in Synthesis Example 1, 0.10 g of the polymer solution (additive) obtained in Synthesis Example 4, 0.25 g of tetramethoxymethyl glycoluril (trade name: POWDERLINK [registered trademark] 1174, manufactured by Nihon Cytec Industries Inc.), 0.025 g of p-toluene sulfonic acid, 191.5 g of propylene glycol monomethyl ether, and 82.1 g of propylene glycol monoethyl ether were mixed and dissolved to prepare the resist underlayer film-forming composition of the present invention.

Example 4

1.00 g of the polymer solution (resin binder) obtained in Synthesis Example 1, 0.10 g of the polymer solution (additive) obtained in Synthesis Example 5, 0.25 g of tetramethoxymethyl glycoluril (trade name: POWDERLINK [registered trademark] 1174, manufactured by Nihon Cytec Industries Inc.), 0.025 g of p-toluene sulfonic acid, 191.5 g of propylene glycol monomethyl ether, and 82.1 g of propylene glycol monoethyl ether were mixed and dissolved to prepare the resist underlayer film-forming composition of the present invention.

Example 5

1.00 g of the polymer solution (resin binder) obtained in Synthesis Example 1, 0.10 g of the polymer solution (additive) obtained in Synthesis Example 6, 0.25 g of tetramethoxymethyl glycoluril (trade name: POWDERLINK [registered trademark] 1174, manufactured by Nihon Cytec Industries Inc.), 0.025 g of p-toluene sulfonic acid, 191.5 g of propylene glycol monomethyl ether, and 82.1 g of propylene glycol monoethyl ether were mixed and dissolved to prepare the resist underlayer film-forming composition of the present invention.

Example 6

1.00 g of the polymer solution (resin binder) obtained in Synthesis Example 1, 0.10 g of the polymer solution (additive) obtained in Synthesis Example 7, 0.25 g of tetramethoxymethyl glycoluril (trade name: POWDERLINK [registered trademark] 1174, manufactured by Nihon Cytec Industries Inc.), 0.025 g of p-toluene sulfonic acid, 191.5 g of propylene glycol monomethyl ether, and 82.1 g of propylene glycol monoethyl ether were mixed and dissolved to prepare the resist underlayer film-forming composition of the present invention.

Comparative Example 1

1.00 g of the polymer solution (resin binder) obtained in Synthesis Example 1, 0.25 g of tetramethoxymethyl glycoluril (trade name: POWDERLINK [registered trademark] 1174, manufactured by Nihon Cytec Industries Inc.), 0.025 g of p-toluene sulfonic acid, 177.6 g of propylene glycol monomethyl ether, and 76.1 g of propylene glycol monoethyl ether were mixed and dissolved to prepare a resist underlayer film-forming composition. This Comparative Example is an example in which the additive according to the present invention is not contained.

Comparative Example 2

1.00 g of the polymer solution (resin binder) obtained in Synthesis Example 1, 0.10 g of the polymer solution (additive) obtained in Synthesis Example 8, 0.25 g of tetramethoxymethyl glycoluril (trade name: POWDERLINK [registered trademark] 1174, manufactured by Nihon Cytec Industries Inc.), 0.025 g of p-toluene sulfonic acid, 191.5 g of propylene glycol monomethyl ether, and 82.1 g of propylene glycol monoethyl ether were mixed and dissolved to prepare a resist underlayer film-forming composition. This Comparative Example is an example in which an additive that is not the additive according to the present invention is contained.

Comparative Example 3

1.00 g of the polymer solution (resin binder) obtained in Synthesis Example 1, 0.10 g of the polymer solution (additive) obtained in Synthesis Example 9, 0.25 g of tetramethoxymethyl glycoluril (trade name: POWDERLINK [registered trademark] 1174, manufactured by Nihon Cytec Industries Inc.), 0.025 g of p-toluene sulfonic acid, 191.5 g of propylene glycol monomethyl ether, and 82.1 g of propylene glycol monoethyl ether were mixed and dissolved to prepare a resist underlayer film-forming composition. This Comparative Example is an example in which an additive that is not the additive according to the present invention is contained.

(Formation and Evaluation of Resist Pattern)

The resist underlayer film-forming composition prepared in each of Examples 1 and 2 and Comparative Examples 1 to 3 of the present invention was applied to a silicon wafer by spin coating, and heated at 205° C. for 1 minute to form a resist underlayer film. For evaluation of hydrophobicity of a surface of the respective resist underlayer films, a contact angle of water on each of the resist underlayer films was measured by a fully-automatic contact angle meter DM700 manufactured by Kyowa Interface Science Co., Ltd. The results are shown in Table 1. As the contact angle of water is larger, the hydrophobicity of the film surface is higher. Onto each of the resist underlayer films, a resist solution for EUV (methacrylate resin-based resist) was applied by spin coating, heated, and exposed by an EUV exposure device (EUV Micro Exposure Tool (MS-13) manufactured by Exitech Ltd.) under conditions of NA=0.35 and σ=0.36/0.68 [Quadrupole]. After the exposure, each of the films was subjected to PEB, cooled to room temperature on a cooling plate, developed, and rinsed to form a resist pattern.

The target line width of the resist pattern to be formed was a line and space pattern with a line width of 30 nm, and depths of focus (DOF) thereof were compared with each other. The results are shown in Table 1. The lines and spaces of each of the resist patterns formed by exposure using the exposure device, development, and rinsing were observed by a critical dimension-scanning electron microscope while the focus position was shifted vertically by 50 μm units on the basis of an optimal focus position. A focus range where collapse or deformation of a pattern is not found was taken as DOF.

TABLE 1

| Resist underlayer film-forming composition | Contact angle of water | DOF (depth of focus) |
|---|---|---|
| Example 1 | 65° | 150 μm |
| Example 2 | 63° | 150 μm |
| Comparative Example 1 | 58° | 50 μm |
| Comparative Example 2 | 58° | 50 μm |
| Comparative Example 3 | 58° | 50 μm |

As shown from Table 1, DOF is large in a case where the resist underlayer film is formed of the resist underlayer film-forming composition containing the additive according to the present invention of each of Examples 1 and 2 compared to a case where the resist underlayer film is formed of the resist underlayer film-forming composition of each of Comparative Examples 1 to 3. Therefore, in the formation of a finer resist pattern, the collapse of the resist pattern can be prevented. Accordingly, it is confirmed that the additive according to the present invention contained in the resist underlayer film-forming compositions of Examples 1 and 2 exhibits a useful effect for prevention of resist pattern collapse.

(Formation and Evaluation of Resist Pattern)

The resist underlayer film-forming composition prepared in each of Examples 3 to 6 and Comparative Example 1 was applied onto a silicon wafer in which a nitrogen-containing silicon oxide film (SiON) (thickness: 31.5 nm) had been vapor-deposited by spin coating so as to have a thickness of 5 nm, and baked at 205° C. for 60 seconds to form a resist underlayer film. Onto each of the respective resist underlayer films, a resist solution for ArF excimer laser (trade name: AR2772JN, manufactured by JSR Corporation) was applied by spin coating, baked at 110° C. for 90 seconds, and exposed by an exposure device for ArF excimer laser (NSR-S307E, manufactured by Nikon Corporation) under a predetermined condition. After the exposure, each of the films was baked (PEB) at 110° C. for 90 seconds, cooled to room temperature on a cooling plate, developed, and rinsed to form a resist pattern.

The target line width of the resist pattern to be formed was a line and space pattern with a line width of 62 nm. In order to investigate a relationship between the change of exposure dose at optimal focus and resist pattern collapse, a resist pattern dimension (pattern collapse limit dimension) at the largest exposure dose (limit exposure dose) in which the resist pattern does not collapse was confirmed by a critical dimension-scanning electron microscope. Thus, it can be confirmed whether the resist pattern collapse at a large exposure dose range is prevented and a finer resist pattern is formed when the additive according to the present invention is used. A cross-sectional shape of the resist pattern of the line and space pattern with a target line width of 62 nm was observed by a cross-sectional scanning electron microscope. Whether the resist pattern is likely to collapse can be judged from the cross-sectional shape of the resist pattern.

The results of the pattern collapse limit dimension and pattern cross-sectional shape of the obtained resist patterns are shown in Table 2. It is preferable that the pattern collapse limit dimension be smaller.

TABLE 2

| Resist underlayer film-forming composition | Pattern collapse limit dimension | Pattern cross-sectional shape |
|---|---|---|
| Example 3 | 52.70 nm | Straight |
| Example 4 | 50.38 nm | Straight |
| Example 5 | 51.08 nm | Straight |
| Example 6 | 52.37 nm | Straight |
| Comparative Example 1 | 54.41 nm | Straight |

As shown from Table 2, the pattern collapse limit dimension is small in a case where the resist underlayer film is formed of the resist underlayer film-forming composition containing the additive according to the present invention of each of Examples 3 to 6 compared to a case where the resist underlayer film is formed from the resist underlayer film-forming composition of Comparative Example 1. Therefore, in the formation of a finer resist pattern, the collapse of the resist pattern can be prevented. In a case where the resist underlayer film is formed of the resist underlayer film-forming composition of each of Examples 3 to 6, all the cross-sectional shapes of the obtained resist patterns have straight shapes (substantially rectangle shapes). Specifically, it is confirmed that the additive according to the present invention contained in each of the resist underlayer film-forming compositions of Examples 3 to 6 exhibits a useful effect for prevention of resist pattern collapse.

The embodiments of the present invention are specifically described above. However, a technical scope of the present invention is not limited to a range described in the embodiments. Various modifications and improvements can be applied to the above embodiments.

The invention claimed is:

1. A resist underlayer film-forming composition for lithography comprising:
   a resin binder,
   an organic solvent,
   a cross-linking agent, and
   an additive comprising a terpolymer comprising a structural unit of Formula (1), a structural unit of Formula (2a), and a structural unit of Formula (2b):

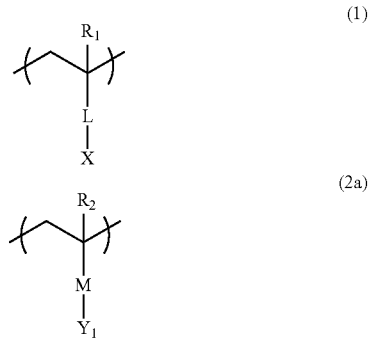

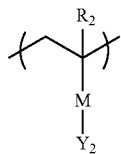

(2b)

where:
R₁ and R₂ are each independently a hydrogen atom or methyl group,
L is a single bond or a divalent linking group,
M is a single bond or a linking group containing at least one selected from the group consisting of a —C(=O)— group, a —CH₂— group, and a —O— group,
X is an aliphatic hydrocarbon group, an alicyclic hydrocarbon group, or a heterocyclic group having an oxygen atom as a heteroatom that does not have a hydroxy group,
Y₁ is a $C_{2-6}$ alkyl group in which at least one hydrogen atom is substituted by a fluorine atom, and
Y₂ is a $C_{1-6}$ alkyl group having at least one hydroxy group, alkoxy group, or carboxyl group,
wherein:
the terpolymer in the additive is contained in an amount in a range of from 5% by mass to 15% by mass relative to a solid content of the resist underlayer film-forming composition obtained by removing the organic solvent, and
a ratio of the resin binder to a solid content of the resist underlayer film-forming composition obtained by removing the organic solvent is in a range of from 60% by mass to 90% by mass.

2. The resist underlayer film-forming composition according to claim 1, wherein the divalent linking group contains at least one selected from the group consisting of a —C(=O)— group, a —CH₂— group, a —O— group, and a phenylene group.

3. The resist underlayer film-forming composition according to claim 1, further comprising a cross-linking catalyst.

4. A method for producing a semiconductor element, comprising:
applying the resist underlayer film-forming composition according to claim 1 onto a substrate having a film to be processed to form a transferred pattern,
baking the resist underlayer film-forming composition to form a resist underlayer film,
coating the resist underlayer film with a resist,
irradiating the substrate coated with the resist with a radiation selected from the group consisting of a KrF excimer laser, an ArF excimer laser, an extreme ultraviolet light, and an electron beam,
developing the resist to form a resist pattern, and
dry-etching the resist using the resist pattern as a mask to transfer the pattern onto the substrate.

* * * * *